(12) United States Patent
Aiba

(10) Patent No.: US 8,697,235 B2
(45) Date of Patent: Apr. 15, 2014

(54) BARRIER LAMINATE AND GAS BARRIER FILM USING THE SAME

(75) Inventor: Satoshi Aiba, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 742 days.

(21) Appl. No.: 12/880,425

(22) Filed: Sep. 13, 2010

(65) Prior Publication Data

US 2011/0064947 A1 Mar. 17, 2011

(30) Foreign Application Priority Data

Sep. 14, 2009 (JP) .................................. 2009-212008

(51) Int. Cl.
*B32B 7/12* (2006.01)

(52) U.S. Cl.
USPC ............... 428/355 EP; 428/343; 428/354; 428/448; 428/451; 428/520; 428/690; 257/40; 522/186; 526/320; 526/326; 526/323.1

(58) Field of Classification Search
None
See application file for complete search history.

(56) References Cited

U.S. PATENT DOCUMENTS

| | | | |
|---|---|---|---|
| 2,681,294 A | 6/1954 | Beguin | |
| 2002/0008840 A1 | 1/2002 | Sakamaki et al. | |
| 2004/0058157 A1 | 3/2004 | Ishikawa | |
| 2004/0192070 A1* | 9/2004 | Tateishi | 438/780 |
| 2006/0251905 A1 | 11/2006 | Arakawa | |
| 2007/0020451 A1* | 1/2007 | Padiyath et al. | 428/336 |
| 2007/0231592 A1* | 10/2007 | Agata | 428/522 |
| 2009/0051278 A1 | 2/2009 | Saneto et al. | |
| 2009/0061223 A1* | 3/2009 | Tsukahara et al. | 428/349 |
| 2009/0324942 A1* | 12/2009 | Tsukahara et al. | 428/339 |

FOREIGN PATENT DOCUMENTS

| | | |
|---|---|---|
| JP | 5-127822 A | 5/1993 |
| JP | 10-512104 A | 11/1998 |
| JP | 2000-227603 A | 8/2000 |
| JP | 2000-323273 A | 11/2000 |
| JP | 2001-150584 A | 6/2001 |
| JP | 2002-48913 A | 2/2002 |
| JP | 2002-80616 A | 3/2002 |
| JP | 2002-86554 A | 3/2002 |
| JP | 2004-25732 A | 1/2004 |
| JP | 2006-289627 A | 10/2006 |
| JP | 2007-30387 A | 2/2007 |
| JP | 2007-290369 A | 11/2007 |
| JP | 2009-21554 A | 1/2009 |
| JP | 2009-70814 A | 4/2009 |
| JP | 2009-81124 A | 4/2009 |
| WO | WO 97/15947 A1 | 5/1997 |

OTHER PUBLICATIONS

Agata Yuya, "Gas barrier laminated film, its manufacturing method and image display element", English translation of Patent application publication No. 2007-290369, date of publication of application Nov. 8, 2007.*
Ha Q Pham, Maurice J. Marks, "Epoxy Resins", Ullmann's Encyclopedia of Industrial Chemistry, published online Oct. 15, 2005.*
Borchure of photocurable monomers/oligomers, from Shin Nakamura Chemical Co., retrived on Aug. 7, 2013, pp. 1-12.*
Search Report from Scientific and Technical Information Center (STIC) dated Apr. 15, 2013, pp. 1-350.*
Office Action for Japanese Application No. 2009-212008, dated Feb. 5, 2013.
G. Nisato et al., "Evaluating High Performance Diffusion Barriers: the Calcium Test", SID Conference Record of the International Display Research Conference, Oct. 16-19, 2001, pp. 1435-1438.
Extended European Search Report dated Dec. 27, 2010 in Application No. 10176548.5.

* cited by examiner

*Primary Examiner* — Callie Shosho
*Assistant Examiner* — Anish Desai
(74) *Attorney, Agent, or Firm* — Birch, Stewart. Kolasch & Birch, LLP

(57) ABSTRACT

Disclosed is a barrier laminate excellent in adhesiveness. The barrier laminate comprises a first organic layer, an inorganic layer, a second organic layer adjacent to the inorganic layer, and an adhesive layer adjacent to the second organic layer in that order, wherein the second organic layer is obtained by curing a polymerizable composition comprising a (meth) acrylate compound comprising a hydroxyl group at a terminal of the compound; and the adhesive layer comprises an epoxy series adhesive.

15 Claims, 1 Drawing Sheet

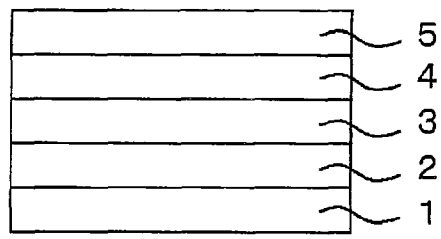

BARRIER LAMINATE AND GAS BARRIER FILM USING THE SAME

FIELD OF THE INVENTION

The invention relates to a barrier laminate, and a gas barrier film using the same. The invention relates to a device using the barrier laminate or the gas barrier film.

DESCRIPTION OF THE RELATED ART

Heretofore, as a support of a device which is required to have high barrier property, a gas barrier film comprising an organic layer and an inorganic layer disposed on a substrate has been used. In order to seal such a device, formation of a barrier laminate or a gas barrier film comprising an organic layer and an inorganic layer on a device has been carried out.

In recent years, such a device is demanded more and more. Thus, barrier laminates and gas barrier films are being studied for enhancing barrier property thereof.

JP-A-2007-290369, for example, discloses that enhancement of the barrier property of a gas barrier film is achieved by adding a (meth)acrylate monomer comprising a phosphoester group into an organic layer of the gas barrier film, to thereby enhance the adhesiveness between the organic layer and the inorganic layer. However, JP-A-2007-290369 fails to disclose the adhesiveness between the organic layer and the adhesive layer.

SUMMARY OF THE INVENTION

The object of the invention is to solve the above problems, and to provide a gas barrier film having higher barrier property.

Barrier laminates are formed by laminating layers each comprising various different materials. When the layers each comprising various different materials are laminated, the adhesiveness in the boundary face of the layers is weak. Especially, the adhesiveness in the boundary face between an adhesive layer and a layer adjacent to the adhesive layer tends to be outstanding. The inventor has presumed that the barrier property of gas barrier films may be enhanced if the adhesiveness between an organic layer and an adhesive layer on a surface of the organic layer of the gas barrier film is enhanced. The inventor has earnestly investigated and found that improvement of the adhesiveness of the boundary face of the both layers can be achieved by comprising a hydroxyl group into the organic layer and using an epoxy series adhesive as an adhesive. Therefore, the invention has been completed.

Specifically, the aforementioned problem can be solved by the following means.

(1) A barrier laminate comprising a first organic layer, an inorganic layer, a second organic layer adjacent to the inorganic layer, and an adhesive layer adjacent to the second organic layer in that order, wherein the second organic layer is obtained by curing a polymerizable composition comprising a (meth)acrylate compound comprising a hydroxyl group at a terminal of the compound; and the adhesive layer comprises an epoxy series adhesive.

(2) The barrier laminate according to (1), wherein the (meth)acrylate compound comprising a hydroxyl group at a terminal of the compound is an acidic monomer.

(3) The barrier laminate according to (1) or (2), wherein the epoxy series adhesive is an epoxy series adhesive comprising a bisphenol skeleton.

(4) The barrier laminate according to (1) or (2), wherein the polymerizable composition for use in the second organic layer further comprises a (meth)acrylate compound comprising a bisphenol skeleton.

(5) The barrier laminate according to (1) or (2), wherein the epoxy series adhesive is an epoxy series adhesive comprising a bisphenol skeleton; and the polymerizable composition for use in the second organic layer further comprises a (meth)acrylate compound comprising a bisphenol skeleton.

(6) The barrier laminate according to any one of (1) to (5), wherein the first organic layer has the same composition as the composition of the second organic layer.

(7) The barrier laminate according to any one of (1) to (6), wherein the inorganic layer is adjacent to the first organic layer.

(8) The barrier laminate according to any one of (1) to (7), wherein the (meth)acrylate compound comprising a hydroxyl group at a terminal of the compound is a (meth)acrylate compound comprising at least one of a phosphoric acid group, a sulfonic acid group and a carboxylic group.

(9) The barrier laminate according to any one of (1) to (7), wherein the (meth)acrylate compound comprising a hydroxyl group at a terminal of the compound is a compound represented by the following formula (P):

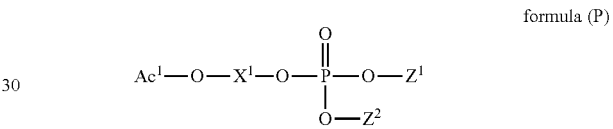

formula (P)

wherein $Z^1$ represents $Ac^2$—O—$X^2$—, a substituent group not comprising a polymerizable group, or a hydrogen atom; $Z^2$ represents $Ac^3$—O—$X^3$—, a substituent group not comprising a polymerizable group, or a hydrogen atom; $Ac^1$, $Ac^2$ and $Ac^3$ each represent an acryloyl group or a (meth)acryloyl group; $X^1$, $X^2$ and $X^3$ each represent an alkylene group, an alkyleneoxy group, an alkyleneoxy carbonyl group, an alkylenecarbonyloxy group, or a combination thereof; and at least one of $Z^1$ and $Z^2$ is a hydrogen atom.

(10) The barrier laminate according to any one of (1) to (9), wherein the polymerizable composition for use in the second organic layer comprises a (meth)acrylate compound comprising a bisphenol skeleton represented by the following formula (1);

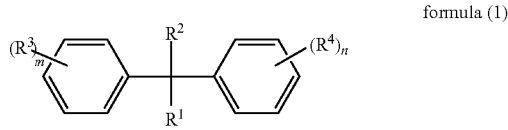

formula (1)

wherein $R^1$ and $R^2$ each are a hydrogen atom, an alkyl group, or an aryl group, $R^1$ and $R^2$ may bond with each other to form a ring; $R^3$ and $R^4$ each are a substituent; in and n each are an integer of 0 to 5; when m is not less than 2, each $R^3$ may be the same or different, and when n is not less than 2, each $R^4$ may be the same or different; and at least two of the groups represented by $R^3$ and $R^4$ comprise a (meth)acryloyloxy group.

(11) The barrier laminate according to any one of (1) to (10), wherein the first organic layer is on the surface of a substrate film.

(12) The barrier laminate according to any one of (1) to (11), wherein the polymerizable composition for use in the second organic layer comprises the (meth)acrylate compound comprising a hydroxyl group at a terminal of the compound in an amount of 0.1 to 20% by weight.

(13) The barrier laminate according to any one of (1) to (12), wherein the polymerizable composition for use in the second organic layer comprises a (meth)acrylate compound comprising a bisphenol skeleton in an amount of 50 to 99.9% by weight.

(14) The barrier laminate according to any one of (1) to (13), wherein the polymerizable composition for use in the second organic layer further comprises a (meth)acrylate compound comprising a bisphenol skeleton represented by the following formula (2):

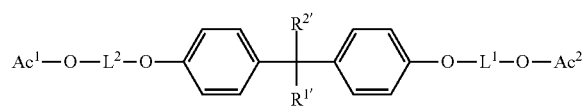

formula (2)

wherein $R^{1'}$ and $R^{2'}$ each are a hydrogen atom, an alkyl group, or an aryl group; $L^1$ and $L^2$ each are a linking group; $Ac^1$ and $Ac^2$ each are an acryloyl group, or a methacryloyl group.

(15) A gas barrier film comprising the barrier laminate of any one of (1) to (14) on a substrate film.
(16) A device comprising the gas barrier film of (15).
(17) The device according to (16), which comprises the gas barrier film of (15) as a support.
(18) The device according to (16) or (17), sealed with the barrier laminate of any one of (1) to (15) or the gas barrier film of (15).
(19) The device according to any one of (16) to (18), which is an electronic device.
(20) The device according to any one of (16) to (18), which is an organic EL device.

The invention makes it possible to provide a gas barrier film excellent in the adhesiveness between an organic layer and an adhesive layer on the organic layer in addition to the adhesiveness between an organic layer and an inorganic layer on the organic layer and in barrier property.

BRIEF DESCRIPTION OF THE DRAWING

FIG. 1 is a diagrammatic illustration showing an example of the gas barrier film of the invention, wherein 1 is a substrate film, 2 is a first organic layer, 3 is an inorganic layer, 4 is a second organic layer, and 5 is an adhesive layer.

DESCRIPTION OF SPECIFIC EMBODIMENTS

The contents of the invention are described in detail hereinunder. In this description, the numerical range expressed by the wording "a number to another number" means the range that falls between the former number indicating the lowermost limit of the range and the latter number indicating the uppermost limit thereof. "Organic EL device" as referred to herein means an organic electroluminescent device. In addition, "(meth)acrylate" means acrylate and methacrylate in the present specification.

The barrier laminate of the invention is characterized in that the barrier laminate comprises a first organic layer, an inorganic layer, a second organic layer adjacent to the inorganic layer, and an adhesive layer adjacent to the second organic layer in that order; the second organic layer is obtained by curing a polymerizable composition comprising a (meth)acrylate compound comprising a hydroxyl group at a terminal of the compound; and the adhesive layer comprises an epoxy series adhesive.

FIG. 1 is a diagrammatic illustration showing an example of a barrier laminate of the invention disposed on a substrate film, in which a substrate film (support), a first organic layer, an inorganic layer, a second organic layer, and an adhesive layer are laminated in that order. In the invention, the second organic layer is obtained by curing a polymerizable composition comprising a (meth)acrylate compound comprising a hydroxyl group at a terminal of the compound and the adhesive layer comprises an epoxy series adhesive. By setting such a construction, the adhesiveness between the second organic layer and the adhesive layer is enhanced in addition that the adhesiveness between the inorganic layer and the second organic layer is enhanced. The adhesiveness between the inorganic layer and the second organic layer is enhanced by adhesion of the hydroxyl group contained in the second organic layer to the inorganic layer. Concerning the adhesiveness between the second organic layer and the adhesive layer, it can be considered that the adhesiveness in the boundary face is improved by reacting the epoxy group contained in the adhesive layer with the hydroxyl group contained in the second organic layer, to thereby form a chemical bond.

Herein, "adjacent to the layer" may be adjacent to over the layer or a part of the layer. In the invention, the layer is preferably adjacent to more part of the layer since the adhesiveness is higher.

Although the first organic layer is adjacent to the inorganic layer in FIG. 1, such an adjacence is not always necessary and a functional layer may be provided between the first organic layer and the inorganic layer. When the first organic layer has the same composition as the second organic layer, the first organic layer is preferably adjacent to the inorganic layer. The adjacence of the both layers enhances its operability and enhances the adhesiveness between the first organic layer and the inorganic layer, to thereby enhance the barrier property thereof. A functional layer may be provided between the first organic layer and the substrate film.

Adhesive Layer

As mentioned above, the adhesive layer is characterized by comprising an epoxy series adhesive. The epoxy series adhesive is not specifically limited for its kinds, and preferably an epoxy series adhesive comprising a bisphenol skeleton. Specific examples thereof include a bisphenol A epoxy adhesive and a bisphenol F epoxy adhesive. By using an epoxy series adhesive comprising a bisphenol skeleton and using a (meth)acrylate compound comprising a bisphenol skeleton as material of the second organic layer, the conformity between the both layers is enhanced and, therefore, the adhesiveness between the adhesive layer and the second organic layer is further enhanced.

Although the adhesive layer may comprise another adhesive and an additive without diverting the scope of the gist of the invention, the adhesive layer preferably comprises the epoxy series adhesive in an amount of 1 to 99% by weight.

Second Organic Layer

The second organic layer is a layer adjacent to an adhesive layer and is obtained by curing a polymerizable composition comprising a (meth)acrylate compound comprising a hydroxyl group at a terminal of the compound. By employing such a layer, the hydroxyl group that the (meth)acrylate compound comprises interact with the epoxy group, to thereby effectively enhance the adhesiveness between the second organic layer and the adhesive layer.

The polymerizable composition inevitably comprises the (meth)acrylate compound comprising a hydroxyl group at a terminal of the compound, and generally comprises a polymerization initiator. The polymerizable composition preferably comprises a (meth)acrylate compound other than the (meth)acrylate compound comprising a hydroxyl group at a terminal of the compound. The other (meth)acrylate compound is not specifically limited for its kinds, and preferably is a (meth)acrylate compound comprising a bisphenol skeleton. By employing such a (meth)acrylate compound comprising a bisphenol skeleton, the barrier property tends to be enhanced. As mentioned above, by using a (meth)acrylate compound comprising a bisphenol skeleton as material of the second organic layer, and using an epoxy series adhesive comprising a bisphenol skeleton as the epoxy series adhesive, the conformity between the both layers is enhanced, and thereby, the adhesiveness between the second organic layer and the adhesive layer is further preferably enhanced.

The polymerizable composition preferably comprises the (meth)acrylate compound comprising a hydroxyl group at a terminal of the compound in an amount of 0.1 to 20% by weight, more preferably in an amount of 1 to 10% by weight. The content of the other (meth)acrylate compound, for example the (meth)acrylate compound comprising a bisphenol skeleton, is preferably 50 to 99.9% by weight, more preferably 60 to 99% by weight. One or more kinds of those compounds may be contained. When two or more kinds of those compounds are contained, the total amount thereof is the above content.

The (meth)acrylate compound comprising a hydroxyl group at a terminal of the compound is preferably an acidic monomer, more preferably an acidic monomer comprising at least one of a phosphoric acid group, a sulfonic acid group and a carboxylic group, further more preferably a compound comprising a phosphoric acid group, even more preferably a compound represented by the formula (P):

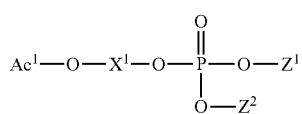

formula (P)

wherein $Z^1$ represents $Ac^2$—O—$X^2$—, a substituent group not comprising a polymerizable group, or a hydrogen atom; $Z^2$ represents $Ac^3$—O—$X^3$—, a substituent group not comprising a polymerizable group, or a hydrogen atom; $Ac^1$, $Ac^2$ and $Ac^3$ each represent an acryloyl group or a (meth)acryloyl group; $X^1$, $X^2$ and $X^3$ each represent an alkylene group, an alkyleneoxy group, an alkyleneoxy carbonyl group, an alkylenecarbonyloxy group, or a combination thereof; and at least one of $Z^1$ and $Z^2$ is a hydrogen atom.

The compound represented by the formula (P) is preferably a monofunctional monomer represented by the formula (P-1), a bifunctional monomer represented by the formula (P-2), or a trifunctional monomer represented by the formula (P-3):

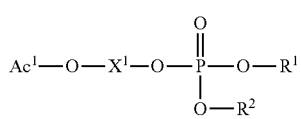

formula (P-1)

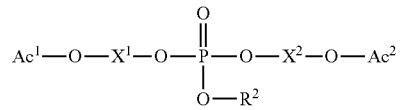

formula (P-2)

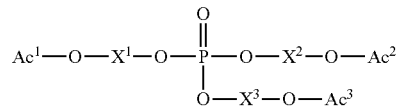

formula (P-3)

The definitions of $Ac^1$, $Ac^2$, $Ac^3$, $X^1$, $X^2$ and $X^3$ are the same as those in the formula (P). In the formula (P-1) and formula (P-2), $R^1$ represents a substituent not comprising a polymerizable group or a hydrogen atom, and $R^2$ represents a substituent group not comprising a polymerizable group, or a hydrogen atom.

In the formula (P), (P-1) to (P-3), the carbon numbers of $X^1$, $X^2$ and $X^3$ are preferably 1 to 12, more preferably 1 to 6, still more preferably 1 to 4. Examples of the alkylene group which $X^1$, $X^2$ and $X^3$ may have, and examples of the alkylnene portion of the alkylenexy group, the alkyleneoxycarbonyl group or the alkylenecarbonyloxy group which $X^2$, $X^2$ and $X^3$ may have include a methylene group, an ethylene group, a propylene group, a butylene group, a pentylene group, and a hexylene group. The alkylene group may be a linear or branched alkylene group, preferably a linear alkylene group. $X^1$, $X^2$ and $X^3$ are preferably an alkylene group.

In the formula (P), (P-1) to (P-3), examples of the substituent group not comprising a polymerizable group include an alkyl group, an alkoxy group, an aryl group and an aryloxy group, and a combination thereof. Preferred is an alkyl group and an alkoxy group, and more preferred is an alkoxy group.

The carbon number of the alkyl group is preferably 1 to 12, more preferably 1 to 9, still more preferably 1 to 6. Examples of the alkyl group include a methyl group, an ethyl group, a propyl group, a butyl group, a pentyl group and a hexyl group. The alkyl group may be a linear, branched, or cyclic group, and preferably a linear alkyl group. The alkyl group may be substituted with an alkoxy group, an aryl group, an aryloxy group, and the like.

The carbon number of the aryl group is preferably 6 to 19, more preferably 6 to 10. Examples of the aryl group include a phenyl group, a 1-naphthyl group, and a 2-naphtyl group. The aryl group may be substituted with an alkyl group, an alkoxy group, an aryloxy group, and the like.

As the alkyl portion of the alkoxy group and the aryl portion of the aryloxy group, the above explanation for the alkyl group and the aryl group may be referred to.

In the invention, the monomer represented by the formula (P) may be used singly or as combined. When the compounds are used as combined, may be used a combination comprising two or more kinds of a monofunctional compound represented by the formula (P-1), a bifunctional compound represented by the formula (P-2) and a trifunctional compound represented by the formula (P-3).

In the invention, as the above polymerizable monomers comprising a phosphoric acid group, may be used commercially available compounds such as KAYAMER series manufactured by NIPPON KAYAKU CO., LTD, and Phosmer series manufactured by Uni chemical, and a compound newly synthesized.

Specific examples of the (meth)acrylate compound comprising a hydroxyl group at a terminal the compound, which is preferably used in the invention, mentioned below, to which, however, the invention should not be limited.

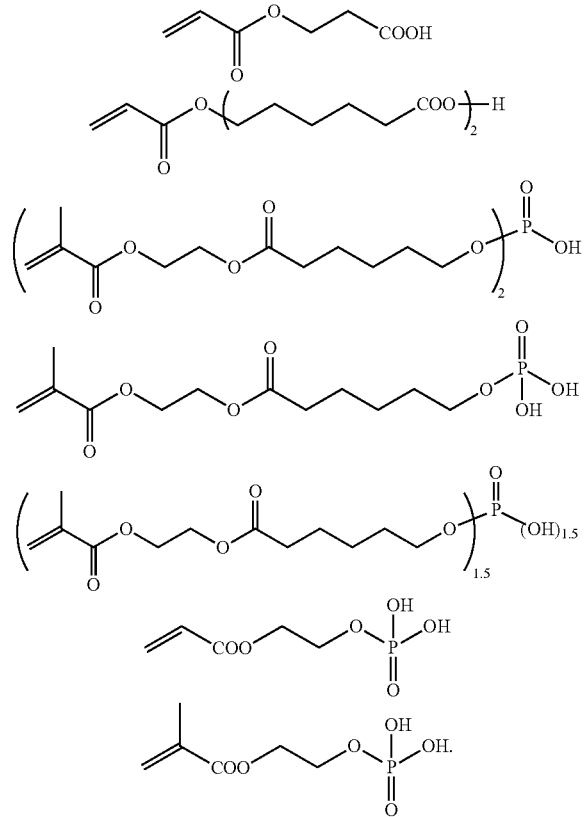

The (meth)acrylate compound comprising a bisphenol skeleton is preferably a compound represented by the following formula (1):

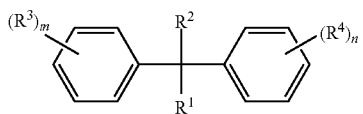

Formula (1)

wherein $R^1$ and $R^2$ each are a hydrogen atom, an alkyl group, or an aryl group, $R^1$ and $R^2$ may bond with each other to form a ring; $R^3$ and $R^4$ each are a substituent; m and n each are an integer of 0 to 5; when m is not less than 2, each $R^3$ may be the same or different, and when n is not less than 2, each $R^4$ may be the same or different; and at least two of the groups represented by $R^3$ and $R^4$ comprise a (meth)acryloyloxy group.

$R^1$ and $R^2$ each are a hydrogen atom, an alkyl group, or an aryl group, $R^1$ and $R^2$ may bond with each other to form a ring. $R^1$ and $R^2$ each are preferably a hydrogen atom, an alkyl group, and an aryl group, and the alkyl group is preferably a methyl group, and the aryl group is preferably a phenyl group. $R^1$ and $R^2$ each are more preferably a hydrogen atom or an alkyl group. When $R^1$ and $R^2$ are an alkyl group and bond with each other to form a ring, $R^1$ and $R^2$ particularly preferably form a 1,1-cyclohexylidene group. When $R^1$ and $R^2$ are an aryl group and bond with each other to form a ring, the whole of $R^1$ and $R^2$ particularly preferably compose a fluorene ring.

$R^1$ and $R^2$ may comprise a substituent. Examples of the substituent include an alkyl group (for example, methyl group, ethyl group, isopropyl group, t-butyl group, n-octyl group, n-decyl group, n-hexadecyl group, cyclopropyl group, cyclopentyl group, cyclohexyl group), an alkenyl group (for example, vinyl group, aryl group, 2-butenyl group, 3-pentenyl group), an aryl group (for example, phenyl group, p-methylphenyl, naphthyl group, anthryl group, phenanthryl group, pyrenyl group), a halogen atom (for example, fluorine atom, chlorine atom, bromine atom, iodine atom), an acyl group (for example, acetyl group, benzoyl group, formyl group, pivaloyl group), an acyloxy group (for example, acetoxy group, acryloyloxy group, methacryloyloxy group), an alkoxycarbonyl group (for example, methoxycarbonyl group, ethoxycarbonyl group), an aryloxycarbonyl group (for example, phenyloxycarbonyl group), a sulfinyl group (methanesulfinyl group, benzenesulfinyl group), a heterocyclic group (it preferably has 1 to 12 carbon atoms, includes a nitrogen atom, an oxygen atom, or a sulfur atom as a hetero atom, and may be an aliphatic heterocyclic group, or a heteroaryl group, and examples thereof include imidazolyl group, pyridyl group, quinolyl group, furyl group, thienyl group, piperidyl group, morpholino group, benzoxazolyl group, benzimidazolyl group, benzothiazolyl group, carbazolyl group, azepinyl group). Those substituent may be further substituted.

$R^3$ and $R^4$ each are a substituent. Examples of $R^3$ and $R^4$ include the same substituents as the above-mentioned substituent for $R^1$ and $R^2$.

m and n each are an integer of 0 to 5. When m is not less than 2, each $R^3$ may be the same or different. When n is not less than 2, each $R^4$ may be the same or different At least two of $R^3$ and $R^4$ in the (meth)acrylate compound represented by the formula (1) comprise a (meth)acryloyloxy group. Preferably all of $R^3$ and $R^4$ in the (meth)acrylate compound represented by the formula (1) comprise a (meth)acryloyloxy group. Examples of a group comprising a (meth)acryloyloxy group include acryloyloxy group, methacryloyloxy group, 2-acryloyloxyetoxy group, 2-methacryloyloxyetoxy group, 2-hydroxy-3-acryloyloxypropoxy group, 2-hydroxy-3-methacryloyloxypropoxy group, 2-octanoyloxy-3-acryloyloxypropoxy group, 2-heptanoyloxy-3-methacryloyloxypropoxy group, 2,3-bis (acryloyloxy)propoxy group, 2,3-bis(methacryloyloxy)propoxy group.

The aromatic (meth)acrylate compound represented by the formula (1) is preferably an aromatic (meth)acrylate compound represented by the following formula (2):

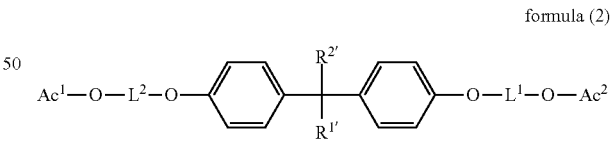

formula (2)

wherein $R^{1'}$ and $R^{2'}$ each are a hydrogen atom, an alkyl group, or an aryl group; $L^1$ and $L^2$ each are a linking group; $Ac^1$ and $Ac^2$ each are an acryloyl group, or a methacryloyl group.

$L^1$ and $L^2$ each are a linking group. Examples thereof include an alkylene group (for example, ethylene group, 1,2-propylene group, 2, 2° propylene group (which may be referred as 2,2-propylidene group, or 1,1-dimethylmethylene), 1,3-propylene group, 2,2-dimethyl-1,3-propylene group, 2-butyl-2-ethyl 1,3-propylene group, 1,6-hexylene group, 1,9-nonilene group, 1,12-dodecylene group, 1,16-hexadecylene), an arylene group (for example, phenylene group, naphthylene group), an ether group, an imino group, a carbonyl group, a sulfonyl group, and a divalent residue formed by bonding plurality of those divalent linking groups in series (for example, polyethylene oxyethylene group, polypropylene oxypropylene group, 2,2-propylene phenylene group). $L^1$ and $L^2$ may have a substituent. Examples of the substituent which substitute $L^1$ or $L^2$ include the same groups as the substituent for $R^1$ and $R^2$ as mentioned above. Those substituents further may be substituted. Of those, preferred is an alkylene group, an arylene group, or a divalent group formed by bonding a plurality thereof.

The molecular weight of the aromatic (meth)acrylate compound represented by the formula (1) is 300 to 1000, preferably 400 to 800. Two or more kinds of aromatic (meth)acrylates represented by the formula (1) may be contained in the polymerizable composition.

Specific examples of the aromatic (meth)acrylate compound represented by the formula (1) are shown below, to which, however, the invention should not be limited.

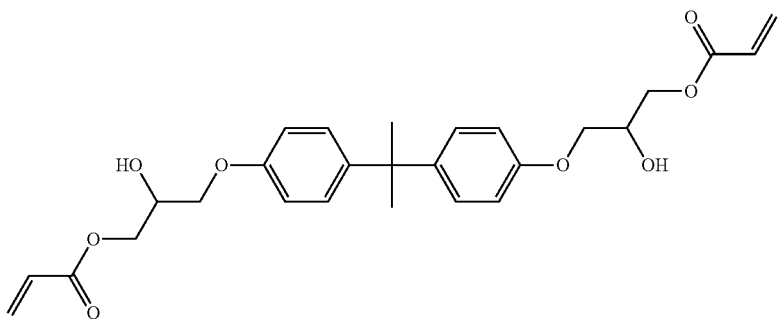

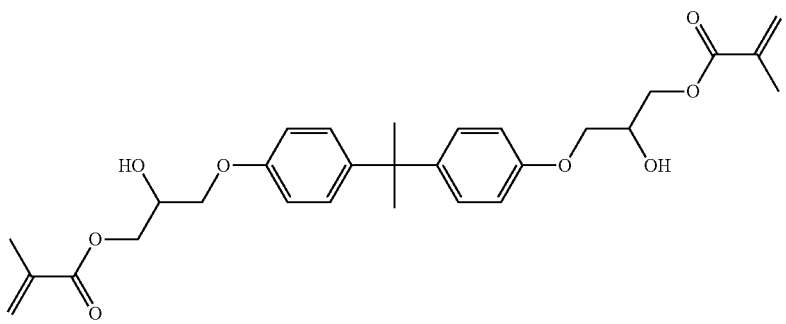

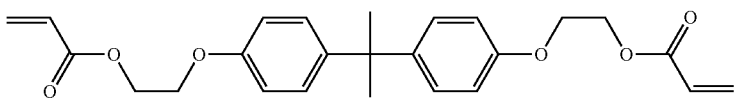

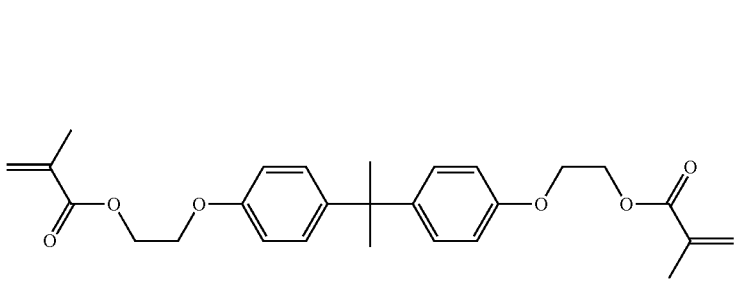

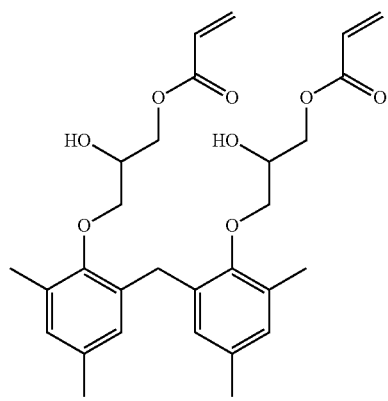

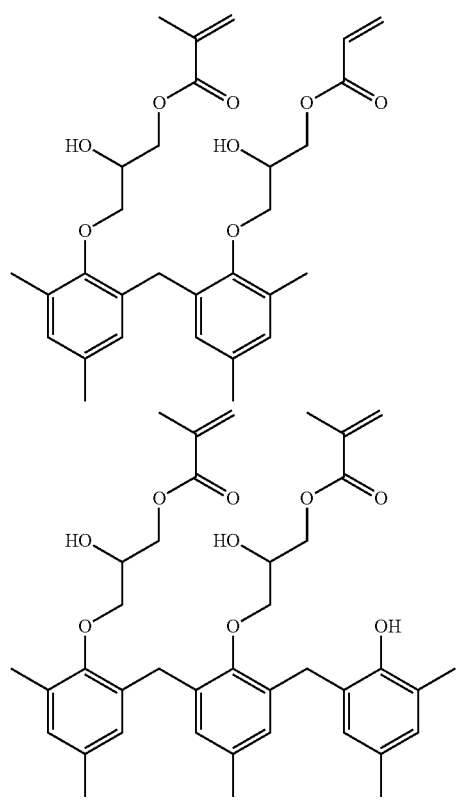
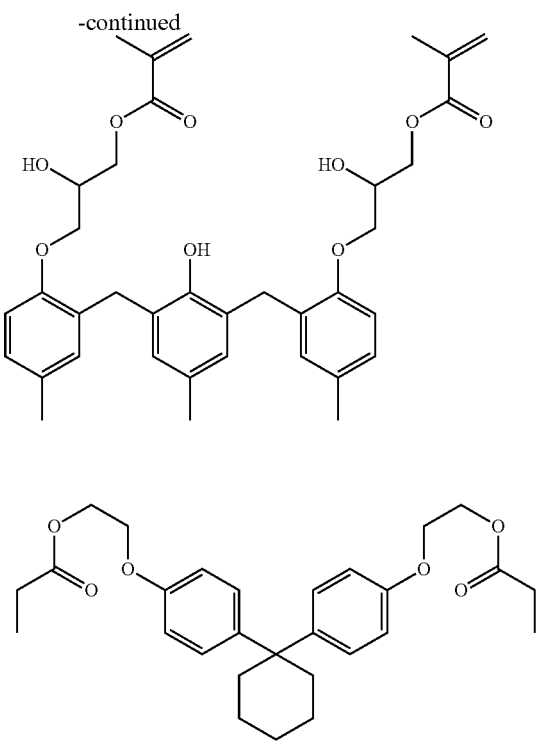
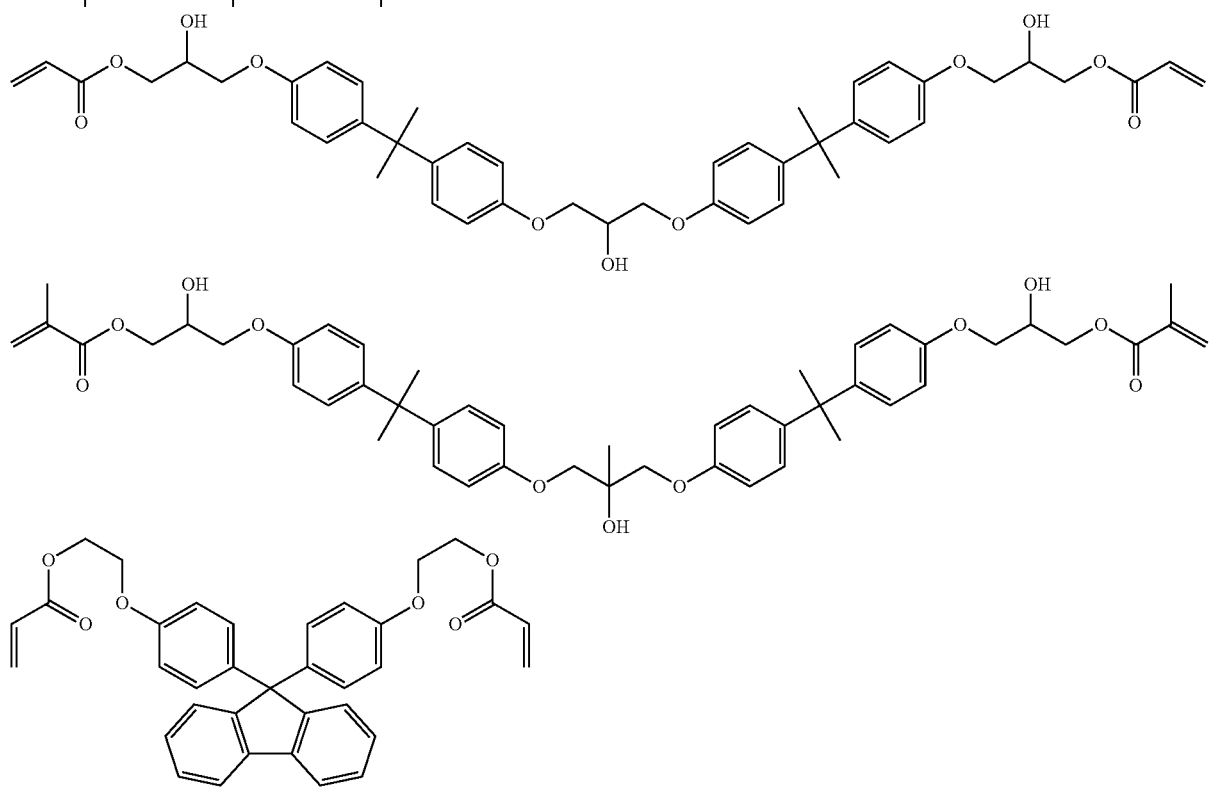

(Polymerization Initiator)

In the case where a photopolymerization initiator is used, its amount is preferably at least 0.1 mol % of the total amount of the polymerizing compound, more preferably from 0.5 to 2 mol %. By setting the thus-designed composition, polymerization reaction though an active ingredient forming reaction may be suitably controlled. Examples of the photopolymerization initiator include Ciba Speciality Chemicals' commercial products, Irgacure series (e.g., Irgacure 651, Irgacure 754, Irgacure 184, Irgacure 2959, Irgacure 907, Irgacure 369, Irgacure 379, Irgacure 819), Darocure series (e.g., Darocure TPO, Darocure 1173), Quantacure PDO; Lamberti's commercial products, Ezacure series (e.g., Ezacure TZM, Ezacure TZT, Ezacure KT046), etc.

(Method of Formation of the Second Organic Layer)

The method for forming the second organic layer is not specifically defined. For example, the layer may be formed according to a solution coating method or a vacuum film formation method. The solution coating method is, for example, a dipping method, an air knife coating method, a curtain coating method, a roller coating method, a wire bar coating method, a gravure coating method, a slide coating method, or an extrusion coating method using a hopper as in U.S. Pat. No. 2,681,294. The vacuum film formation method is not specifically defined, but is preferably a film formation method by vapor deposition or plasma CVD, and the like. In the invention, the polymer may be applied for coating as its solution, or a hybrid coating method along with an inorganic material, as in JP-A 2000-323273 and 2004-25732, may also be used.

In the invention, the composition comprising the polymerizable monomer is cured by irradiation. The light for irradiation is generally a UV ray from a high-pressure mercury lamp or low-pressure mercury lamp. The radiation energy is preferably at least 0.1 J/cm$^2$, more preferably at least 0.5 J/cm$^2$. (Meth) acrylate series compounds may suffer from interference in polymerization owing to oxygen in air, and therefore, in their polymerization, the oxygen concentration or the oxygen partial pressure is preferably lowered. In the case where the oxygen concentration in polymerization is lowered according to a nitrogen purging method, the oxygen concentration is preferably not more than 2%, more preferably not more than 0.5%. In the case where the oxygen partial pressure in polymerization is lowered by a pressure reduction method, the whole pressure is preferably not more than 1000 Pa, more preferably not more than 100 Pa. Especially preferred is UV polymerization with at least 0.5 J/cm$^2$ energy radiation under a condition of reduced pressure of not more than 100 Pa.

The second organic layer preferably has a smoothness surface and the hardness of the organic layer is preferably higher. Preferably, the rate of polymerization of monomer is at least 85%, more preferably at least 88%, even more preferably at least 90%, still more preferably at least 92%. The rate of polymerization as referred to herein means the ratio of the reacted polymerizable group to all the polymerizing group (acryloyl group and methacryloyl group) in the monomer mixture. The rate of polymerization may be quantitatively determined according to IR absorptiometry.

The thickness of the second organic layer is not specifically defined. However, when the layer is too thin, then its thickness could hardly keep uniformity; but when too thick, the layer may be cracked by external force applied thereto and its barrier property may lower. From these viewpoints, the thickness of the organic layer is preferably from 50 nm to 2000 nm, more preferably from 200 nm to 1500 nm.

As so mentioned in the above, the second organic layer is preferably smooth. The mean roughness (Ra) in 1 µm square is preferably not more than 1 nm, more preferably not more than 0.5 nm. The surface of the organic layer is required not to have impurities and projections such as particles. Accordingly, it is desirable that the second organic layer is formed in a clean room. The degree of cleanness is preferably not more than class 10000, more preferably not more than class 1000.

Generally preferably the hardness of the organic layer is higher. When the hardness of the organic layer is higher, the inorganic layer is smoothly disposed to result in improvement of barrier property. The hardness of the organic layer may be expressed as an icrohardness based on a nano-indentation method. The microhardness of the organic layer is preferably at least 100 N/mm, more preferably at least 150 N/mm.

First Organic Layer

The first organic layer is a layer between a substrate film and an inorganic layer and is preferably adjacent to an inorganic layer. The preferred range of the first organic layer is the same as that of the second organic layer. Particularly, the second organic layer preferably has the same composition as that of the first organic layer. Use of the same composition makes possible to easier produce the barrier laminate. When the second organic layer has the same composition as the first organic layer has, adhesiveness between the first organic layer and the inorganic layer is enhanced, to thereby enhance the barrier property of the barrier laminate.

(Inorganic Layer)

The inorganic layer is, in general, a layer of a thin film formed of a metal compound. For forming the inorganic layer, employable is any method capable of producing the intended thin film. For it, for example, suitable are physical vapor deposition methods (PVD) such as vapor evaporation method, sputtering method, ion plating method; various chemical vapor deposition methods (CVD); liquid phase growth methods such as plating or sol-gel method. Not specifically defined, the component to be in the inorganic layer may be any one satisfies the above-mentioned requirements. For example, it includes metal oxides, metal nitrides, metal carbides, metal oxide-nitrides, or metal oxide-carbides. Preferably used are oxides, nitrides, carbide oxide-nitrides, or oxide-carbides comprising at least one metal selected from Si, Al, In, Sn, Zn, Ti, Cu, Ce and Ta. Of those, preferred are oxides, nitrides carbide oxide-nitrides, or oxide-carbides of a metal selected from Si, Al, In, Sn, Zn and Ti; more preferred are metal oxides, nitrides or oxide-nitrides with Si or Al. These may contain any other element as a subsidiary component.

Preferably, the surface smoothness of the inorganic layer formed in the invention is less than 1 nm in terms of the mean roughness (Ra value) in 1 µm square, more preferably not more than 0.5 nm. Accordingly, it is desirable that the inorganic layer is formed in a clean room. Preferably, the degree of cleanness is not more than class 10000, more preferably not more than class 1000.

Not specifically defined, the thickness of the inorganic layer is generally within a range of from 5 to 500 nm/layer, preferably from 10 to 200 nm/layer.

(Lamination of Organic Layer and Inorganic Layer)

The organic layer and the inorganic layer may be laminated by repeated film formation to form the organic layer and the inorganic layer in a desired layer constitution. In case where the inorganic layer is formed according to a vacuum film formation method such as sputtering method, vacuum evaporation method, ion plating method or plasma CVD method, then it is desirable that the organic layer is also formed according to a vacuum film formation method such as the above-mentioned flash vapor deposition method. While the barrier laminate is formed, it is especially desirable that the organic layer and the inorganic layer are laminated any time in a vacuum of not more than 1000 Pa, not restoring the pressure to an atmospheric pressure during the film formation. More preferably, the pressure is not more than 100 Pa, even more preferably not more than 50 Pa, still more preferably not more than 20 Pa.

The number of layers are preferably 3 to 20.

(Functional Layer)

The device of the invention may have a functional layer on the barrier laminate or in any other position. The functional layer is described in detail in JP-A 2006-289627, paragraphs 0036 to 0038. Examples of other functional layers than those are a matting agent layer, a protective layer, an antistatic layer, a planarizing layer, an adhesiveness improving layer, a light shielding layer, an antireflection layer, a hard coat layer, a stress relaxing layer, an antifogging layer, an anti-soiling layer, a printable layer, an adhesive layer, etc.

(Use of Barrier Laminate)

In general, the barrier laminate of the invention is formed on a support. Selecting the support, the barrier laminate may have various applications. The support includes a substrate film, as well as various devices, optical members, etc. Concretely, the barrier laminate of the invention may be used as a barrier layer of a gas barrier film. The barrier laminate and the gas barrier film of the invention may be used for sealing up devices that require gas-barrier property. The barrier laminate and the gas barrier film of the invention may apply optical members. These are described in detail hereinunder.

<Gas Barrier Film>

The gas barrier film comprises a substrate film and a barrier laminate formed on the substrate film. In the gas barrier film, the barrier laminate of the invention may be provided only one surface of the substrate film, or may be provided on both surfaces thereof.

The gas barrier film of the invention is a film substrate comprising a barrier layer that functions to block oxygen, water, nitrogen oxide, sulfur oxide, ozone and others in air.

The gas barrier film may have any other constitutive components (e.g., functional layers such as adhesive layer) in addition to the barrier laminate and the substrate film. The functional layer may be disposed on the barrier laminate, or between the barrier laminate and the substrate film, or on the side (back) of the substrate film not coated with the barrier laminate.

(Plastic Film)

In the gas barrier film of the invention, the substrate film is generally a plastic film. Not specifically defined in point of the material and the thickness thereof, the plastic film usable herein may be any one capable of supporting a laminate of an organic layer and an inorganic layer; and it may be suitably selected depending on the use and the object thereof. Concretely, the plastic film includes thermoplastic resins such as polyester resin, methacryl resin, methacrylic acid-maleic anhydride copolymer, polystyrene resin, transparent fluororesin, polyimide, fluoropolyimide resin, polyamide resin, polyamidimide resin, polyetherimide resin, cellulose acylate resin, polyurethane resin, polyether ether ketone resin, polycarbonate resin, alicyclic polyolefin resin, polyarylate resin, polyether sulfone resin, polysulfone resin, cycloolefin copolymer, fluorene ring-modified polycarbonate resin, alicyclic-modified polycarbonate resin, fluorene ring-modified polyester resin, acryloyl compound.

In case where the gas barrier film of the invention is used as a substrate of a device such as an organic EL device to be mentioned hereinunder, it is desirable that the plastic film is formed of a heat-resistant material. Concretely, the plastic film is preferably formed of a heat-resistant transparent material having a glass transition temperature (Tg) of not lower than 100° C. and/or a linear thermal expansion coefficient of not less than 40 ppm/° C. Tg and the linear expansion coefficient may be controlled by the additives to the material. The thermoplastic resin of the type includes, for example, polyethylene naphthalate (PEN: 120° C.), polycarbonate (PC: 140° C.) alicyclic polyolefin (e.g., Nippon Zeon's Zeonoa 1600: 160° C.), polyarylate (PAr: 210° C.), polyether sulfone (PES: 220° C.), polysulfone (PSF: 190° C.), cycloolefin copolymer (COC, compound described in JP-A 2001-150584: 162° C.), polyimide (Mitsubishi gas chemical company's Neopulim: 260° C.), fluorene ring-modified polycarbonate (BCF-PC, compound described in JP-A 2000-227603: 225° C.), alicyclic-modified polycarbonate (IP-PC, compound described in JP-A 2000-227603: 205° C.), acryloyl compound (compound described in JP-A 2002-80616: 300° C. or more) (the parenthesized data are Tg). In particular, for high transparency, use of alicyclic polyolefin is preferred.

In the case where the gas barrier film of the invention is used in combination with a polarizing plate, it is preferable that the gas barrier layer surface of the gas barrier film is faced at the inside of a cell and is disposed in the innermost (adjacent to the device). At that time, since the gas barrier film is disposed in the inside of the cell relative to the polarizing plate, a retardation value of the gas barrier film is important. As to a use form of the gas barrier film in such an embodiment, it is preferable that a barrier film using a base material film having a retardation value of not more than 10 nm and a circular polarizing plate ((quarter-wave plate)+(half-wave plate)+(linear polarizing plate)) are laminated and used, or that a linear polarizing plate is combined with a gas barrier film using a base material film having a retardation value of from 100 nm to 180 nm, which can be used as a quarter-wave plate, and used.

Examples of the base material film having a retardation of not more than 10 nm include cellulose triacetate (FUJITAC, manufactured by Fujifilm Corporation), polycarbonates (PURE-ACE, manufactured by Teijin Chemicals Ltd.; and ELMECH, manufactured by Kaneka Corporation), cycloolefin polymers (ARTON, manufactured by JSR Corporation; and ZEONOR, manufactured by Zeon Corporation), cycloolefin copolymers (APEL (pellet), manufactured by Mitsui Chemicals, Inc.; and TOPAS (pellet), manufactured by Polyplastics Co., Ltd.), polyarylates (U100 (pellet), manufactured by Unitika Ltd.) and transparent polyimides (NEOPULIM, manufactured by Mitsubishi Gas Chemical Company).

Also, films obtained by properly stretching the foregoing film to adjust it so as to have a desired retardation value can be used as the quarter-wave plate.

In view of the matter that the gas barrier film of the invention is utilized as a device such as organic EL devices, the plastic film must be transparent, namely its light transmittance is usually not less than 80%, preferably not less than 85%, and more preferably not less than 90%. The light transmittance can be measured by a method described in JIS-K7105, namely by measuring a total light transmittance and an amount of scattered light using an integrating sphere type light transmittance analyzer and subtracting the diffuse transmittance from the total light transmittance.

Even in the case where the gas barrier film of the invention is used for display use, for example, when it is not disposed on the side of an observer, the transparency is not always required. Accordingly, in such case, an opaque material can also be used as the plastic film. Examples of the opaque material include a known liquid crystal polymer such as polyimides and polyacrylonitrile.

The thickness of the plastic film to be used for the gas barrier film of the invention is properly chosen depending upon the use and therefore, is not particularly limited. It is typically from 1 to 800 µm, and preferably from 10 to 200 µm. These plastic films may have a functional layer such as a transparent conductive layer and a primer layer. The functional layer is described in detail in paragraphs 0036 to 0038 of JP-A-2006-289627.

<Device>

The barrier laminate and the gas barrier film of the invention are favorably used for devices that are deteriorated by the chemical components in air (e.g., oxygen, water, nitrogen oxide, sulfur oxide, ozone). Examples of the devices are, for example, organic EL devices, liquid-crystal display devices, thin-film transistors, touch panels, electronic papers, solar cells, other electronic devices. More preferred are organic EL devices.

The barrier laminate of the invention may be used for film-sealing of devices. Specifically, this is a method of providing a barrier laminate of the invention on the surface of a device serving as a support by itself. Before providing the barrier laminate, the device may be covered with a protective layer.

The gas barrier film of the invention may be used as a substrate of a device or as a film for sealing up according to a solid sealing method. The solid sealing method comprises forming a protective layer on a device, then forming an adhesive layer and a gas barrier film as laminated thereon, and curing it. Not specifically defined, the adhesive may be a thermosetting epoxy resin, a photocurable acrylate resin, etc.

(Organic EL Device)

Examples of an organic EL device with a gas barrier film are described in detail in JP-A 2007-30387.

(Liquid-Crystal Display Device)

A reflection-type liquid-crystal display device has a constitution of a lower substrate, a reflection electrode, a lower alignment film, a liquid-crystal layer, an upper alignment film, a transparent electrode, an upper substrate, a λ/4 plate and a polarizing film, formed in that order from the bottom. In this, the gas barrier film of the invention may be used as the transparent electrode substrate and the upper substrate. In color displays, it is desirable that a color filter layer is additionally provided between the reflection electrode and the lower alignment film, or between the upper alignment film and the transparent electrode. A transmission-type liquid-crystal display device has a constitution of a backlight, a polarizer, a λ/4 plate, a lower transparent electrode, a lower alignment film, a liquid-crystal layer, an upper alignment film, an upper transparent electrode, an upper substrate, a λ/4 plate and a polarizing film, formed in that order from the bottom. In this, the substrate of the invention may be sued as the upper transparent electrode and the upper substrate. In color displays, it is desirable that a color filter layer is additionally provided between the lower transparent electrode and the lower alignment film, or between the upper alignment film and the transparent electrode. Not specifically defined, the type of the liquid-crystal cell is preferably a TN (twisted nematic) type, an STN (super-twisted nematic) type, a HAN (hybrid aligned nematic) type, a VA (vertically alignment) type, an ECB (electrically controlled birefringence) type, an OCB (optically compensatory bent) type, an IPS (in-plane switching) type, or a CPA (continuous pinwheel alignment) type.

(Solar Cell)

The barrier film substrate of the invention can be used also as a sealing film for solar cell devices. Preferably, the barrier film substrate of the invention is used for sealing a solar cell device in such a manner that its adhesive layer is on the side near to the solar cell device. The solar cell devices for which the barrier film substrate of the invention is favorably used are not specifically defined. For example, they include single crystal silicon-based solar cell devices, polycrystalline silicon-based solar cell devices, single-junction or tandem-structure amorphous silicon-based solar cell devices, gallium-arsenic (GaAs), indium-phosphorus (InP) or the like III-V Group compound semiconductor-based solar cell devices, cadmium-tellurium (CdTe) or the like II-VI Group compound semiconductor-based solar cell devices, copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices, dye-sensitized solar cell devices, organic solar cell devices, etc. Above all, in the invention, the solar cell devices are preferably copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices.

<Electronic Paper>

The gas barrier film of the invention can be used in an electronic paper. The electronic paper is a reflection-type electronic display capable of attaining a high precision and a high contrast.

The electronic paper has a display media and a TFT driving the display media on a substrate. Any known display media can be used in the electronic paper. For example, any display media of electophoretic-type, electopowder flight-type, charged tonner-type, electrochromic type can be preferably used. Among them, electophoretic display media is more preferable and microcapsule-type electophoretic display media is particularly preferable. The electophoretic display media has a plural number of capsules and each capsule has at least one particle capable of moving in a suspension flow. The at least one particle is preferably an electrophoretic particle or a spinning ball. The electrophretic display media has a first plane and a second plane that are placed in parallel, and an image is displayed through one of the two planes.

A TFT formed on a substrate comprises a gate electrode, gate insulating layer, an active layer, a source electrode and a drain electrode. A TFT also comprises a resistance layer between the active layer and the source electrode and/or between the active layer and the drain electrode to attain electric connection.

When a color display with a high precision is produced, TFT's are preferably formed on a color filter to precisely align them. Normal TFT with a low electric efficiency can not be down-sized much while obtaining the necessary driving current, and when a high precision display is pursued, the rate of the area for the TFT in a pixel must be high. When the rate of the area for the TFT is high, the rate of the opening area and contrast are low. Even when a transparent amorphous IGZO-type TFT is used, light transmittance is not 100% and reduction of contrast is unavoidable. Use of the TFT disclosed in JP-A 2009-21554 and the like can reduce the rate of the TFT in a pixel and improve the rate of the opening area and contrast. High precision can also be attained by forming this type of TFT on a color filter directly.

(Others)

Other applications of the invention are thin-film transistors as in JP-T H10-512104, and touch panels as in JP-A 5-127822, 2002-48913.

<Optical Member>

Examples of the optical member that comprises the barrier laminate of the invention are a circular polarizer and the like.

(Circular Polarizer)

Laminating a gas barrier film of the invention with a λ/4 plate and a polarizer gives a circular polarizer. In this case, the components are so laminated that the slow axis of the λ/4 plate could cross the absorption axis of the polarizer at an angle of 45°. The polarizer is preferably stretched in the direction of 45° from the machine direction (MD) thereof; and for example, those described in JP-A 2002-865554 are favorably used.

EXAMPLES

The characteristics of the invention are described more concretely with reference to the following Examples. Accordingly, the invention should not be limitatively interpreted by the Examples mentioned below.

1. Formation of a Gas Barrier Film

A polyethylene naphthalate film (manufactured by Teijin DuPont Films Japan Limited, Teonex® Q65FA) was cut into 20 cm square. At the smoothness side of the film, a barrier layer was formed by the following method.

(1-1) Formation of the First Organic Layer

On the PEN film, a polymerizable composition consisting of a polymerizable compound consisting of a composition shown in Table 1 (18.6 g), an ultraviolet polymerization initiator (manufactured by Lamberti, ESACURE KT046) (1.4 g) and 2-butanone (180 g) was coated with by bar coating method so that the polymerizable composition has a thickness of 5 μm. Then, it was put into a chamber having an oxygen concentration of 0.1% by nitrogen substitution, and the first organic layer was cured therein through irradiation with UV light from a high-pressure mercury lamp (integrated radiation was about 1 J/cm$^2$), thereby constructing the first organic layer having a thickness of 600 nm±50 nm.

(1-2) Formation of the Inorganic Layer

Using a sputtering apparatus, an inorganic layer (aluminium oxide) was formed on the surface of the first organic layer. Aluminium as a target, argon as discharge gas, and oxygen as reactive gas were used. The formation pressure was 0.1 Pa. The thickness was 60 nm. Thus, the inorganic layer was formed on the first organic layer, to thereby form a gas barrier film.

(1-3) Formation of the Second Organic Layer

The second organic layer was formed according to the same method as that of the first organic layer.

(1-4) Formation of Epoxy Adhesive Layer

Any one of the epoxy series adhesives (A-1 to A-3) and the curing agent (B-1) were mixed so that the amount of the epoxy group is the same molar equivalent as the amount of the amine group. The mixture was coated on a glass substrate using a wire bar so as to have a thickness of 10 μm, thereby forming the adhesive layer.

(1-5) Formation of Isocyanate Adhesive Layer

Any one of the epoxy series adhesive (A-4) and the curing agent (B-2) were mixed so that the ratio of A-4:B-2 is 17:2. The mixture was coated on a glass substrate using a wire bar so as to have a thickness of 10 μm, thereby forming the adhesive layer.

(1-6) Adhesion of the Adhesive Layer to the Gas Barrier Film

On a strip-shaped glass substrate (5 cm×10 cm), an adhesive layer was formed on a half part of the strip-shaped glass substrate (5 cm×5 cm), according to the method in the above (1-4) or (1-5). Next, a strip-shaped gas barrier film having the same size of the glass substrate was stuck to the glass substrate so that the second organic layer faces to the adhesive layer.

Using the obtained sample consisting of the gas barrier film and the glass substrate, the adhesiveness between the adhesive layer and the second organic layer was measured and evaluated.

Differently, each piece of the gas barrier films was measured and evaluated for the gas barrier property.

The following table shows a polymerizable compound for use in the first organic layer and the second organic layer, and an adhesive for use in the adhesive layer.

TABLE 1

|  | Polymerizable Compound (Weight Ratio) | Adhesive |
|---|---|---|
| Example 1 | BFA-1/PA (17.6/1.0) | A-1/B-1 |
| Example 2 | BFA-1/BFA-2/PA (5.6/12.0/1.0) | A-1/B-1 |
| Example 3 | TMPAT/PA (17.6/1.0) | A-1/B-1 |
| Example 4 | BFA-1/CA-1 (17.6/1.0) | A-1/B-1 |
| Example 5 | BFA-1/CA-2 (17.6/1.0) | A-1/B-1 |
| Example 6 | TMPTA/CA-1 (17.6/1.0) | A-1/B-1 |
| Example 7 | TMPTA/CA-2 (17.6/1.0) | A-1/B-1 |
| Example 8 | BFA-2/PA (17.6/1.0) | A-1/B-1 |
| Example 9 | BFA-1/PA (17.6/1.0) | A-2/B-1 |
| Example 10 | TMPTA/PA (17.6/1.0) | A-2/B-1 |
| Example 11 | BFA-1/CA-1 (17.6/1.0) | A-2/B-1 |
| Example 12 | TMPTA/CA-2 (17.6/1.0) | A-2/B-1 |
| Example 13 | BFA-1/PA (17.6/1.0) | A-3/B-1 |
| Example 14 | BFA-1/CA-1 (17.6/1.0) | A-3/B-1 |
| Example 15 | TMPTA/PA (17.6/1.0) | A-3/B-1 |
| Example 16 | TMPTA/CA-1 (17.6/1.0) | A-3/B-1 |
| Comp. Exam. 1 | BFA-1 | A-1/B-1 |
| Comp. Exam. 2 | BFA-1/PA (17.6/1.0) | A-4 |
| Comp. Exam. 3 | BFA-1 | A-4 |
| Comp. Exam. 4 | TMPTA | A-1/B-1 |

BFA-1: manufactured by Shin-Nakamura Chemical Co., Ltd., NK Oligo EA-1020

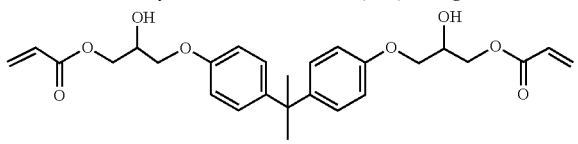

BFA-2: manufactured by Shin-Nakamura Chemical Co., Ltd., NK ester A-BPE-4

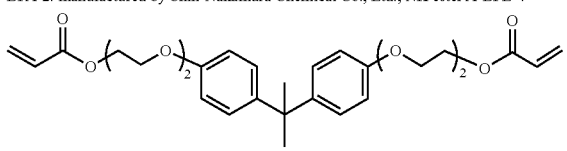

PA: manufactured by Nippon Kayaku Co., Ltd., KARAMER PM-21

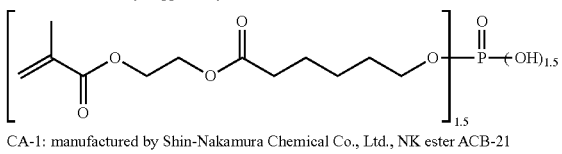

CA-1: manufactured by Shin-Nakamura Chemical Co., Ltd., NK ester ACB-21

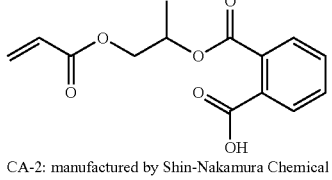

CA-2: manufactured by Shin-Nakamura Chemical Co., Ltd., NK ester CBX-0

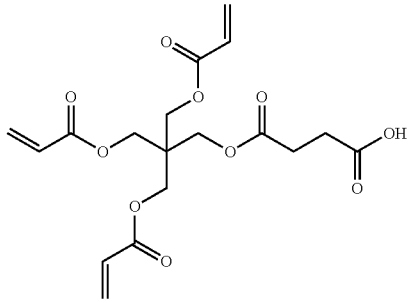 [SMILES: C=CC(=O)OCC(COC(=O)C=C)(COC(=O)C=C)COC(=O)CCC(=O)O]

TMPTA: manufactured by Daicel-Cytec Company Ltd.

TABLE 1-continued

| Polymerizable Compound (Weight Ratio) | Adhesive |
|---|---|

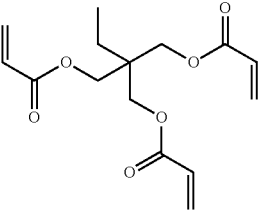 [SMILES: C=CC(=O)OCC(CC)(COC(=O)C=C)COC(=O)C=C]

A-1: bisphenol A epoxy adhesive: manufactured by Japan Epoxy Resin Co, Ltd., jER828
A-2: bisphenol F epoxy adhesive: manufactured by Japan Epoxy Resin Co, Ltd., jER806
A-3: naphthalene type epoxy resin: manufactured by DIC Corporation, EPICLON HP-4032D
A-4: polyisocyanate series adhesive: manufactured by Dainichiseika Color & Chemicals Mfg. Co., Ltd., seika bond E-372
B-1: epoxy curing agent: manufactured by Sanyo Chemical Industries, Ltd., polymide L-4051
B-2: isocyanate seris curing agent: manufactured by Dainichiseika Color & Chemicals Mfg. Co., Ltd., seika bond C-76-2.0

<Evaluation of Adhesiveness>

Using the adhered sample as formed in the above (1-6), sensitive test for adhesiveness was carried out. The glass substrate was laminated on the gas barrier film, and then, the gas barrier film was peeled from the edge which was not attached to the adhesive. The adhesiveness was evaluated depending on the degree of the peeling as follows:
4: no peeling was achieved, or the film was broken.
3: peeling was partially achieved with resistance.
2: peeling was achieved with less resistance.
1: peeling was completely achieved without resistance.
0: adhesion was not carried out. When the sample was turned over, the gas barrier film was peeled and fallen.

<Evaluation of Water Vapor Permeability according to Ca Method>

The water vapor permeability ($g/m^2/day$) was measured according to the method described in G. NISATO, P. C. P. BOUTEN, P. J. SLIKKERVEER, et al.; SID Conference Record of the International Display Research Conference 1435-1438. The measure was carried out at 40° C. and 90% RH. The results are shown in the following table.

TABLE 2

| | Barrier Property ($g/m^2/day$) | Evaluation of adhesiveness |
|---|---|---|
| Example 1 | 0.001 | 4 |
| Example 2 | 0.001 | 4 |
| Example 3 | 0.004 | 4 |
| Example 4 | 0.003 | 4 |
| Example 5 | 0.003 | 4 |
| Example 6 | 0.005 | 4 |
| Example 7 | 0.005 | 4 |
| Example 8 | 0.002 | 4 |
| Example 9 | 0.001 | 4 |
| Example 10 | 0.004 | 4 |
| Example 11 | 0.003 | 4 |
| Example 12 | 0.005 | 4 |
| Example 13 | 0.001 | 3 |
| Example 14 | 0.003 | 3 |
| Example 15 | 0.004 | 3 |
| Example 16 | 0.005 | 3 |
| Comp. Exam. 1 | 0.001 | 2 |
| Comp. Exam. 2 | 0.001 | 1 |
| Comp. Exam. 3 | 0.001 | 1 |
| Comp. Exam. 4 | 0.005 | 1 |

As is clear from the above, it was found that the adhesiveness is further enhanced by using a (meth)acrylate compound comprising a hydroxyl group at a terminal of the compound as material of the organic layer. It was further found that the adhesiveness is further enhanced by using a (meth)acrylate compound comprising a bisphenol skeleton as well as a (meth)acrylate compound comprising a phosphoric acid group.

2. Evaluation in Organic EL Device

Formation of Organic EL Device

An ITO film-having conductive glass substrate (surface resistivity, 10Ω/square) was washed with 2-propanol, and then processed for UV ozone treatment for 10 minutes. On the substrate (anode), the following compound layers were formed in order by vapor deposition according to a vacuum vapor deposition method.

(First Hole Transporting Layer)
Copper phthalocyanine: film thickness 10 nm.
(Second Hole Transporting Layer)
N,N'-diphenyl-N,N'-dinaphthylbenzidine: film thickness 40 nm.
(Light-Emitting Layer Also Serving as Electron Transporting Layer)
Tris (8-hydroxyquinolinato) aluminium: film thickness 60 nm.
(Electron Injection Layer)
Lithium fluoride: film thickness 1 nm.

Aluminium was formed on it through vapor deposition to form a cathode having a thickness of 100 nm, and a silicon nitride film having a thickness of 5 μm was formed thereon according to a parallel plate CVD method, thereby constructing an organic EL device.

Formation of Gas Barrier Layer on the Organic EL Device

On the above gas barrier film, an adhesive layer was formed according to the method (1-4) or (1-5), so that the adhesive layer adhere to the surface of the organic EL device. Then, the adhesive layer was cured. Thus 20 pieces of the sealed organic EL devices were formed.

Evaluation of Light Emission Surface of the Organic EL Device

Just after produced, the organic EL device was tested for light emission under application of 7 V thereto, using a source measure unit (SMU2400 Model by Keithley). Using a microscope, the light-emitting surface was observed, which confirmed uniform light emission by every device with no dark spot.

Next, the devices were stored in a dark room at 60° C. and 90% RH for 500 hours, and then tested for light emission surface. For the ratio of the devices in which a dark spot having a diameter of 300 μm or more was observed was 5% or less for all the devices.

The present disclosure relates to the subject matter contained in Japanese Patent Application No. 212008/2009 filed on Sep. 14, 2009, which is expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A barrier laminate comprising a first organic layer, an inorganic layer, a second organic layer adjacent to the inorganic layer, and an adhesive layer adjacent to the second organic layer in that order, wherein the second organic layer is obtained by curing a polymerizable composition comprising a (meth)acrylate compound; and the adhesive layer comprises an epoxy adhesive, wherein the (meth)acrylate compound is at least one compound selected from the group consisting of

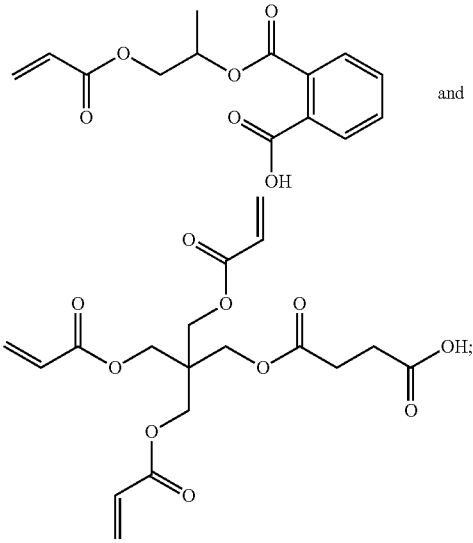

wherein the epoxy adhesive is an epoxy adhesive comprising a bisphenol skeleton, and wherein the polymerizable composition for use in the second organic layer further comprises a (meth)acrylate compound comprising a bisphenol skeleton.

2. The barrier laminate according to claim 1, wherein the first organic layer has the same composition as the composition of the second organic layer.

3. The barrier laminate according to claim 1, wherein the inorganic layer is adjacent to the first organic layer.

4. The barrier laminate according to claim 1, wherein the (meth)acrylate compound comprising a bisphenol skeleton is represented by the following formula (1):

formula (1)

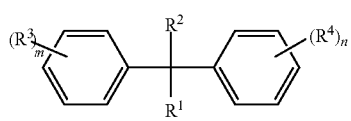

wherein $R^1$ and $R^2$ each are a hydrogen atom, an alkyl group, or an aryl group, $R^1$ and $R^2$ may bond with each other to form a ring; $R^3$ and $R^4$ each are a substituent; m and n each are an integer of 0 to 5; when m is not less than 2, each $R^3$ may be the same or different, and when n is not less than 2, each $R^4$ may be the same or different; and at least two of the groups represented by $R^3$ and $R^4$ comprise a (meth)acryloyloxy group.

5. The barrier laminate according to claim 1, wherein the first organic layer is on a surface of a substrate film.

6. The barrier laminate according to claim 1, wherein the polymerizable composition for use in the second organic layer comprises the (meth)acrylate compound selected from the group consisting of

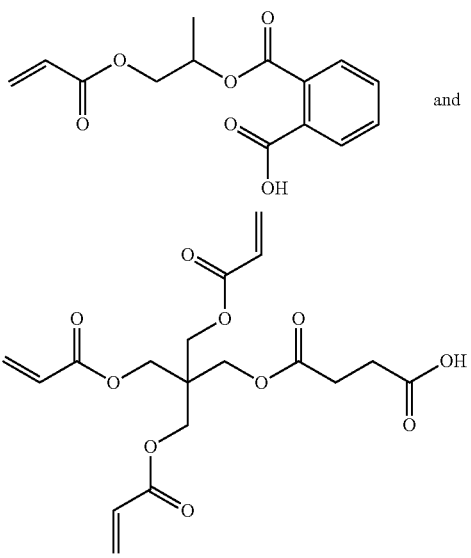

in an amount of 0.1 to 20% by weight.

7. The barrier laminate according to claim 1, wherein the polymerizable composition for use in the second organic layer comprises the (meth)acrylate compound comprising a bisphenol skeleton in an amount of 50 to 99.9% by weight.

8. The barrier laminate according to claim 1, wherein the (meth)acrylate compound comprising a bisphenol skeleton is represented by the following formula (2):

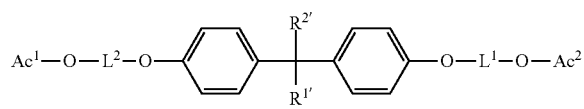

wherein $R^{1'}$ and $R^{2'}$ each are a hydrogen atom, an alkyl group, or an aryl group; $L^1$ and $L^2$ each are a linking group; $Ac^1$ and $Ac^2$ each are an acryloyl group, or a methacryloyl group.

9. The device according to claim 1, wherein the (meth)acrylate compound comprising a bisphenol skeleton is

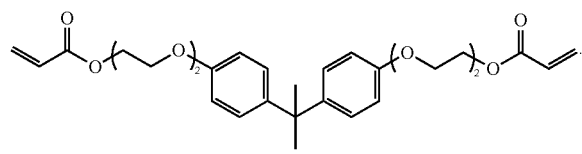

10. A device comprising a barrier laminate on a substrate film, wherein the barrier laminate comprises a first organic layer, an inorganic layer, a second organic layer adjacent to the inorganic layer, and an adhesive layer adjacent to the second organic layer in that order; the second organic layer is obtained by curing a polymerizable composition comprising a (meth)acrylate compound; and the adhesive layer comprises an epoxy adhesive, wherein the (meth)acrylate compound is at least one compound selected from the group consisting of

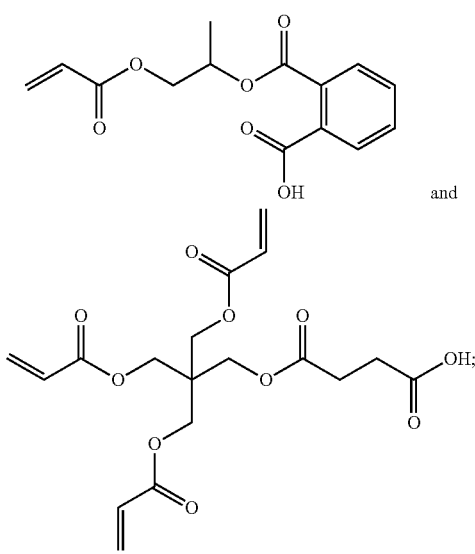

wherein the epoxy adhesive is an epoxy adhesive comprising a bisphenol skeleton, and wherein the polymerizable composition for use in the second organic layer further comprises a (meth)acrylate compound comprising a bisphenol skeleton.

11. The device according to claim 10, which comprises a gas barrier film comprising the barrier laminate on the substrate film as a support.

12. The device according to claim 10, sealed with the barrier laminate or a gas barrier film comprising the barrier laminate on the substrate film.

13. The device according to claim 10, which is an electronic device.

14. The device according to claim 10, which is an organic electroluminescent (EL) device.

15. The device according to claim 10, wherein the (meth) acrylate compound comprising a bisphenol skeleton is

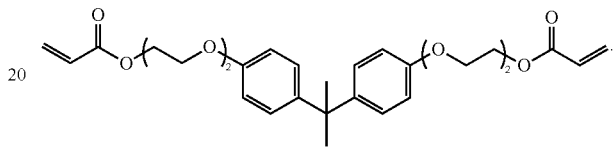

* * * * *